United States Patent [19]
Yamauchi

[11] Patent Number: 5,623,165
[45] Date of Patent: Apr. 22, 1997

[54] INSULATED GATE FIELD EFFECT SEMICONDUCTOR DEVICE AND FORMING METHOD THEREOF

[75] Inventor: Yukio Yamauchi, Kanagawa, Japan

[73] Assignee: Semiconductor Energy Laboratory Co., Ltd., Kanagawa, Japan

[21] Appl. No.: 599,103

[22] Filed: Feb. 9, 1996

Related U.S. Application Data

[63] Continuation of Ser. No. 213,056, Mar. 15, 1994, abandoned.

[30] Foreign Application Priority Data

Mar. 16, 1993 [JP] Japan ..................................... 5-082654

[51] Int. Cl.[6] .......................... H01L 23/48; H01L 23/52; H01L 29/40; H01L 29/76
[52] U.S. Cl. ........................ 257/756; 257/366; 257/270
[58] Field of Search .......................... 257/270, 364–366, 257/388, 412, 413, 316, 317, 755, 66, 756

[56] References Cited

U.S. PATENT DOCUMENTS

| | | | |
|---|---|---|---|
| 5,021,849 | 6/1991 | Pfiester et al. ........................... | 257/365 |
| 5,237,196 | 8/1993 | Mikata et al. ........................... | 257/412 |

FOREIGN PATENT DOCUMENTS

| | | | |
|---|---|---|---|
| 53-79383 | 7/1978 | Japan | 257/412 |
| 3-227516 | 10/1991 | Japan | 257/412 |
| 4-188673 | 7/1992 | Japan | 257/412 |

*Primary Examiner*—Stuart S. Levy
*Assistant Examiner*—Adriana Giordana
*Attorney, Agent, or Firm*—Sixbey, Friedman, Leedom & Ferguson, PC; Gerald J. Ferguson, Jr.; Jeffrey L. Costellia

[57] ABSTRACT

In an insulated gate field effect semiconductor device, the gate electrode formed on the gate insulating film includes the first and second semiconductor layers as a double layer. An impurity for providing one conductivity type is not contained in first semiconductor layer which is in contact with a gate insulating film and is contained at a high concentration in the second semiconductor layer which is not in contact with the gate insulating film. Accordingly, By existence of the first semiconductor layer is which the impurity is not doped, the impurity is prevented from penetrating through the gate insulating film from the gate electrode and diffusing into the channel forming region. Also, by existence of the second semiconductor layer in which high concentration impurity is doped, the gate electrode has low resistance.

14 Claims, 4 Drawing Sheets

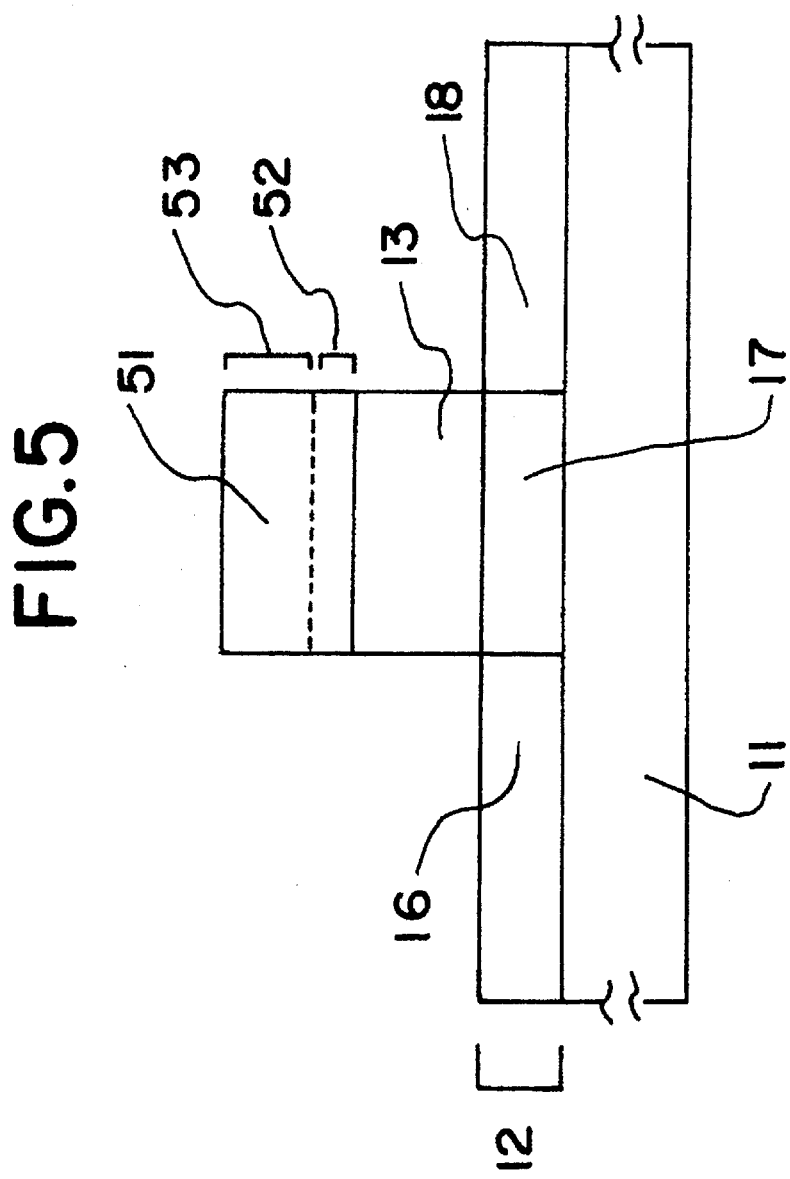

INSULATED GATE FIELD EFFECT SEMICONDUCTOR DEVICE AND FORMING METHOD THEREOF

This application is a continuation of Ser. No. 08/213,056, filed Mar. 15, 1994, now abandoned.

BACKGROUND OF THE INVENTION

1. Field of the Invention

This invention relates to an insulated gate field effect semiconductor device using a thin film semiconductor (hereinafter referred to as a TFT) and a method for forming the insulated gate field effect semiconductor device, and particularly to a gate electrode and a method for forming the gate electrode.

2. Description of Related Art

A self-alignment type of structure has been known as a conventional TFT structure. In this structure, impurity material which provides one conductivity type is doped by an ion implantation method or the like using a gate electrode portion as a mask to form source/drain regions.

FIGS. 1A and 1B show a representative structure of this self-alignment structure of a TFT. In FIG. 1A, the structure includes an insulating substrate 21 of glass or the like, a thin film semiconductor layer 22 in which a source region 25, a channel forming region 27 and a drain region 26 are formed, a gate insulating film 23 and a gate electrode 24. Also, electrodes, layer insulating films, wirings, etc. which are well known but are not shown in FIG. 1A, are also formed in this structure.

In FIG. 1A, the semiconductor layer 22 is formed of amorphous silicon or crystallized amorphous silicon. The source region 25 and the drain region 26 are doped with phosphorus to form N-type regions. Accordingly, the TFT as shown in FIG. 1A is an N-channel type TFT. The gate insulating film 23 is formed of silicon oxide ($SiO_2$), and the gate electrode 24 is formed of a silicon film which is doped with a large amount of phosphorus in order to reduce the resistance of the gate electrode 24.

The TFT shown in FIG. 1A is formed as follows. The amorphous silicon semiconductor layer 22 is first formed on the substrate 21 by a vapor phase method. Thereafter, the amorphous silicon semiconductor layer 22 is heated or irradiated with a laser beam in order to crystallize it, whereby the amorphous silicon semiconductor layer is transformed to crystallized silicon.

Subsequently, an oxidized silicon film serving as the gate insulating film 23 is formed by a sputtering method or the like and a silicon film doped with phosphorus, serving as the gate electrode 24, is formed by a vapor phase method or the like. Thereafter the gate insulating film 23 and the gate electrode 24 are formed in a patterning process to obtain an intermediate product having the shape shown in FIG. 1A. Subsequently, implantation (introduction) of phosphorus ions (hereinafter referred to as "ion implantation") is performed using the gate electrode 24 as a mask to form the source region 25 and the drain region 26 in a self-alignment structure. In this case, the channel forming region 27 is automatically formed.

Thereafter, through heat treatment, activation of the introduced phosphorus impurity and scratch of the semiconductor layer 22 in the ion implantation process are annealed. In this heat treatment, the gate electrode 24 formed of amorphous silicon is crystallized.

In this case, the following problem occurs.

In the heat treatment after the ion implantation process, the phosphorus diffuses from the gate electrode 24 and penetrates through the gate insulating film 23 to the channel forming region 27, as indicated by arrows 28 of FIG. 1B, so that the channel forming region 27 becomes an N-type region. As a result, the channel forming region does not function effectively, and the characteristic of the TFT deteriorates.

In order to solve the above problem, the following methods (a) to (d) may be adopted:

(a) Adoption of a doping method which requires no heat treatment, (b) Lowering the heat treatment temperature and shortening the heat treatment time, (c) Lowering the concentration of introduced phosphorus ions into the gate electrode 24, and (d) Use of a metal material requiring no ion implantation for the gate electrode.

The method (a) is not realistic because the doping system itself must be altered. That is, those devices and forming methods which are presently used cannot be utilized.

The method (b) cannot obtain various effects, such as the improvement of interface characteristics at the interface between the channel forming region 27 and the gate insulating film 23 which are obtained by heat treatment, the restoration of damage of the semiconductor layer 22 which occurs in the ion implantation process, etc., and thus does not basically solve the problem. In practical use, as a compromise, a heat treatment condition is set in a suitable permissible range in consideration of the treatment temperature and treatment time in the heat treatment process and the degree of diffusion of the impurities into the channel forming region.

The method (c) necessarily causes the resistance of the gate electrode to be increased, and this causes an increase in wiring resistance and cannot obtain the characteristics of the TFT.

In the method (d), the heat tolerance temperature of the metal material of the gate electrode 24 is an important factor in the heat treatment process after ion implantation and a subsequent protection film forming process. Therefore, the heat treatment temperature is restricted. Further, there is a problem in that although the gate electrode is not melted, the metal material of the gate electrode 24 diffuses into the channel forming region 27.

The above problems occur similarly for both N-channel type Tats and P-channel type TFTs, and are not dependent on elements introduced by ion implantation.

SUMMARY OF THE INVENTION

An object of the present invention is to provide a TFT structure and a forming method thereof in which introduced ions are prevented from penetrating through a gate insulating film 23 and diffusing into a channel forming region 27 in a heat treatment process after ion implantation during manufacture of a TFT having a self-alignment structure as shown in FIG. 1A.

In order to attain the above object, according to a first aspect of the present invention, an insulated gate field effect semiconductor device is characterized in that the concentration of impurities which provides one conductivity type in a gate electrode formed of a semiconductor material is set to be low in one region of the gate electrode which is in contact with a gate insulating film, and set to be high in the other region.

According to the first aspect of the present invention, the concentration of impurities which provides one conductivity type in the gate electrode is set to be low at one side of the gate electrode which is in contact with the gate insulating film, and set to be high at the opposite side of the gate electrode to the gate insulating film. Therefore, the amount of impurities which penetrate from the gate electrode through the gate insulating film in a TFT forming process can be reduced. The following structure can be provided to realize a structure according to the first aspect of the invention.

In the following description, the construction of each part of FIG. 2 is the same as the construction shown in FIG. 1A, except for the structure of the gate electrode 24.

In the structure of the TFT as shown in FIG. 2, the gate electrode 24 formed of the semiconductor layer is so designed that the impurity providing one conductivity type is contained at a low concentration at one side 31 of the gate electrode 24 which is in contact with the gate insulating film 23, and in high concentration at the other (opposite) side 32 of the gate electrode 24 which is not in contact with the gate insulating film 23.

The structure of TFT as shown in FIG. 2 may be realized by a method wherein the impurity which provides one conductivity type is gradually doped into the gate electrode 24 from starting of film formation of the gate electrode 24 in accordance with the progress of the film formation of the gate electrode 24, or by a method wherein the gate electrode is made a multi-layered structure and the respective layers of the multi-layered structure are successively formed one by one while varying the concentration of the impurity which provides one conductivity type.

Accordingly, the former method provides a gate electrode having a continuously-variable impurity concentration distribution, and the latter method provides a gate electrode having a stepwise-variable impurity concentration distribution.

According to a second aspect of the present invention, the insulated gate field effect semiconductor device is characterized in that a gate electrode of semiconductor material having a double-layer structure is provided, and an impurity which provides one conductivity type is contained in low concentration in one layer of the gate electrode which is in contact with a gate insulating film, and in high concentration in the other layer of the gate electrode which is not in contact with the gate insulating film.

The second aspect of the present invention has one structure which makes concrete the structure of the first aspect of the invention described above. That is, in the structure shown in FIG. 2, the gate electrode 24 is designed in a double layer structure, and the layer (arranged in a portion represented by the number 31) at one side of the gate electrode 24 which is in contact with the gate insulating film 23 is designed to contain a low concentration of an impurity which provides one conductivity type while the layer (arranged in a portion represented by the number 32) at the other side of the gate electrode 23 which is opposite to the gate insulating film 23 is designed to contain a high concentration of the impurity which provides one conductivity type.

According to a third aspect of the present invention, the insulated gate field effect semiconductor device is characterized in that a gate electrode of a multi-layer structure which is formed of semiconductor material is provided, and the impurity which provides one conductivity type is contained in low concentration in a layer of the gate electrode which is in contact with a gate insulating film, and in high concentration in the other layers of the gate electrode which are not in contact with the gate insulating film.

The third aspect of the present invention corresponds to the structure obtained by making the gate electrode of the first aspect of the invention a multi-layer structure. Further, when the number of layers is limited to two, the structure corresponds to the structure of the second aspect of the invention.

A fourth aspect of the present invention relates to a forming method of an insulated field effect semiconductor device having a gate electrode formed of a multi-layered semiconductor layer, and is characterized by comprising the steps of forming on a gate insulating film a first semiconductor layer which is substantially intrinsic, then forming a second semiconductor layer while doping an impurity which provides one conductivity type onto the first semiconductor layer.

The fourth aspect of the present invention relates to a forming method when realizing the third aspect of the invention. That is, the fourth aspect of the invention is characterized in that, for the formation of the gate electrode, the first layer which is in contact with the gate insulating film is formed as a substantially intrinsic semiconductor layer, and the impurity for providing one conductivity type is doped when the second layer is formed on the first layer.

With the above construction, when the source/drain regions are formed in the ion implantation process and the subsequent heat treatment process, the first layer (corresponding to a portion 31 in FIG. 2, for example) serves as a buffer layer, and the impurity for providing one conductivity type which is doped in the second layer (corresponding to a portion 32 in FIG. 2, for example) can be suppressed or practically prevented from penetrating through the gate insulating film and diffusing into the channel forming region. The impurity for providing one conductivity type is diffused from the second layer into the first layer. In this case, it is desired that the first layer is preferably designed to be of one conductivity type.

Further, by doping the second layer with a large amount of impurity for providing one conductivity type, the electrical resistance of the gate electrode itself can be sufficiently reduced.

A fifth aspect of the present invention relates to a forming method of an insulated gate field effect semiconductor device having a gate electrode formed of a multi-layer semiconductor layer, and is characterized by comprising the steps of forming a first semiconductor on a gate insulating film while doping an impurity for providing one conductivity type at low concentration, and forming a second semiconductor layer on the first semiconductor layer while doping the impurity at a higher concentration than that in forming of the first semiconductor layer.

The fifth aspect of the present invention is a modification of the fourth aspect of the invention, and the first layer which is in contact with the gate electrode is doped with the impurity for providing one conductivity type in such an amount that no practical problem occurs. Of course, the doping amount of the impurity into the first layer must be determined in consideration of the fact that the impurity penetrates through the gate insulating film and diffuses into the channel forming region in the ion implantation and heat treatment processes to form the source/drain regions. That is, the doping amount of the impurity into the first layer must be reduced to such a value that diffusion of the impurity is insignificant.

A sixth aspect of the present invention relates to a forming method of an insulated gate field effect semiconductor device having a gate electrode formed of semiconductor material, and is characterized by a step of forming a gate electrode on a gate insulating film while doping an impurity for providing one conductivity type, wherein, in the film forming step as described above, doping of the impurity is not performed at the time of film formation initiating, then the doping amount is continuously increased or increased stepwise in accordance with the progress of the film formation.

According to the sixth aspect of the present invention, in the gate electrode having a single-layer structure, doping is not performed at the time of film formation initiating. Thereafter, at the stage where film formation has proceeded, the film formation is performed while doping the impurity for providing one conductivity type. Accordingly, as shown in the embodiment of FIG. 2, the doping concentration of the layer (region) 31 is low and the doping concentration of the layer (region) 32 is high after the ion implantation and heat treatment processes.

A seventh aspect of the present invention relates to a forming method of an insulated gate field effect semiconductor device having a gate electrode formed of a semiconductor material, and is characterized by comprising a step of forming a gate electrode on a gate insulating film while doping an impurity for providing one conductivity type, wherein in the above film forming process of the gate electrode, the doping of the impurity at a low concentration is performed at starting of film formation, and the doping concentration is increased continuously or stepwise in accordance with the progress of the film formation.

The seventh aspect of the invention corresponds to a case where the impurity for providing one conductivity type is doped at a low concentration into the region which is in contact with the gate insulating film (corresponds to the region 31 in FIG. 2) in the sixth aspect of the invention. In the seventh aspect of the invention, the doping amount of the impurity to be doped at the time of film formation initiating must be determined in the ion implantation and heat treatment processes so that the doped impurity is prevented from penetrating through the gate insulating film and diffusing into the channel forming region.

According to this invention, a non-doped semiconductor or low concentration impurity doped semiconductor is formed at the one side of the gate electrode which is in contact with the gate insulating film, and a high concentration impurity doped semiconductor is formed on the above semiconductor. Accordingly, when ion implantation is performed using the gate electrode as a mask to form the source/drain regions, the impurity for providing one conductivity type which is doped in the gate electrode is prevented from penetrating from the gate electrode through the gate insulating film and diffusing to the outside. In addition, the gate electrode can be designed to have a low resistance.

BRIEF DESCRIPTION OF THE DRAWINGS

FIG. 5 shows a basic structure of a TFT of another embodiment of this invention.

DETAILED DESCRIPTION OF THE PREFERRED EMBODIMENTS

Preferred embodiments according to the present invention will be described below.

[Embodiment 1]

The following describes a preferred embodiment utilized in the present invention.

Figure 3:
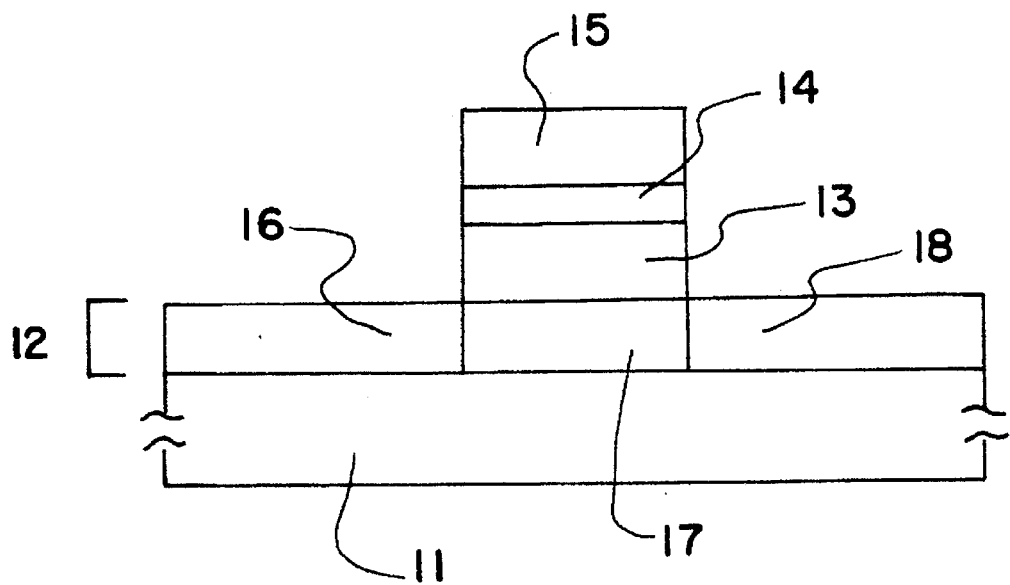
FIG. 3 shows a basic structure of a TFT of another embodiment of this invention.

The basic construction of this embodiment of TFT (Thin Film Transistor) is shown in FIG. 3. In FIG. 3, reference numeral 11 represents a glass substrate, reference numeral 12 represents a semiconductor layer (1500 Å in thickness) of crystalline silicon, reference numeral 13 represents a silicon oxide film (1000 Å in thickness) serving as a gate insulating film, reference numeral 14 represents a non-doped silicon semiconductor layer constituting a gate electrode, and reference numeral 15 represents a silicon semiconductor layer (2000 Å in thickness) doped with a high concentration of phosphorus, serving as the gate electrode. The doping concentration of the phosphorus ions into the silicon semiconductor layer 15 is $1\times10^{21}/cm^3$. Further, reference numeral 16 is a source region, 17 is a channel forming region and 18 is a drain region.

In this embodiment, in the construction described above, the phosphorus concentration at the interface between the channel forming region 17 and the gate insulating film 13 is calculated in accordance with a five stage variation of the thickness of the non-doped silicon semiconductor layer 14, that is, 0 Å (a state where non-doped silicon semiconductor layer 14 does not exist), 100 Å, 200 Å, 300 Å and 400 Å.

That is, by examining the phosphorus concentration at the interface between the channel forming region 17 and the gate insulating film 13, the amount of phosphorus diffused from the silicon semiconductor layer 15 to the channel forming region 17 can be known. From this calculation, the effect of the non-doped silicon semiconductor layer 14 can be effectively determined.

[Forming method of TFT]

First, the forming method of the TFT of the embodiment shown in FIG. 3 will be hereinafter described.

First, the amorphous silicon semiconductor layer 12 is formed (deposited) at a thickness of 1000 Å on the glass substrate 11 by a well known low pressure CVD (Chemical Vapor Deposition) method. The formation conditions are as follows.

Pressure 0.5 Torr
Temperature 520° C.
Film forming gas SiH$_4$ 200 sccm

Subsequently, the amorphous silicon semiconductor layer 12 is heated to crystallize it. The crystallization conditions are as follows.

Pressure atmospheric pressure
Temperature 600° C.

Time 48 hours
Atmosphere $N_2$

Subsequently, the silicon oxide film ($SiO_2$) serving as the gate insulating film is formed at a thickness of 1000 Å on the amorphous silicon semiconductor layer 12 by a magnetron sputtering method. The formation conditions are as follows.
RF power (13.56 MHz) 400 W
Pressure 0.5 Pa
Atmosphere (sputter gas) $O_2$
Substrate temperature 150° C.

Subsequently, the non-doped silicon semiconductor layer 14 which is the first semiconductor layer serving as the gate electrode is formed to a desired thickness on the gate insulating film 13 by the low pressure CVD method. The formation conditions are as follows.
Film forming temperature 640° C.
Film forming pressure 0.5 Torr
Film forming gas $SiH_4$ 200 sccm Next, the silicon semiconductor layer 15 doped with high concentration phosphorus which is the second semiconductor layer serving as the gate electrode is formed on the non-doped silicon semiconductor layer 14 by the low pressure CVD method. The formation conditions are as follows.
Film forming temperature 600° C.
Film forming pressure 0.5 Torr
Film forming gas $PH_3/SiH_4$=0.5% 200 sccm Through the above film formation, the silicon semiconductor layer 15 doped with phosphorus of $1\times10^{21}/cm^3$ is formed.

Subsequently, ion implantation is performed to form the source region 16, the drain region 18 and the channel forming region 17 in a self-alignment structure. In this process, the source region 16 and the drain region 18 are doped with phosphorus to about $1.7\times10^{19}/cm^3$.

After the ion implantation, the heat treatment is performed to active phosphorus ions and the annealing of scratches due to the ion implantation. The heat treatment conditions are as follows.
Treatment temperature 600° C.
Treatment time 24 hours
Treatment atmosphere $N_2$ gas
Treatment pressure Atmospheric pressure If necessary, wirings for the source electrode, the drain electrode, the gate electrode, etc. are formed (not shown).

In this embodiment, the gate electrode is designed in a double-layer structure, however, it may be designed in a multi-layer structure. In this case, it is effective to vary the doping concentration stepwise from the layer which is in contact with the gate insulating film.

[Estimation Method]

Figure 4:
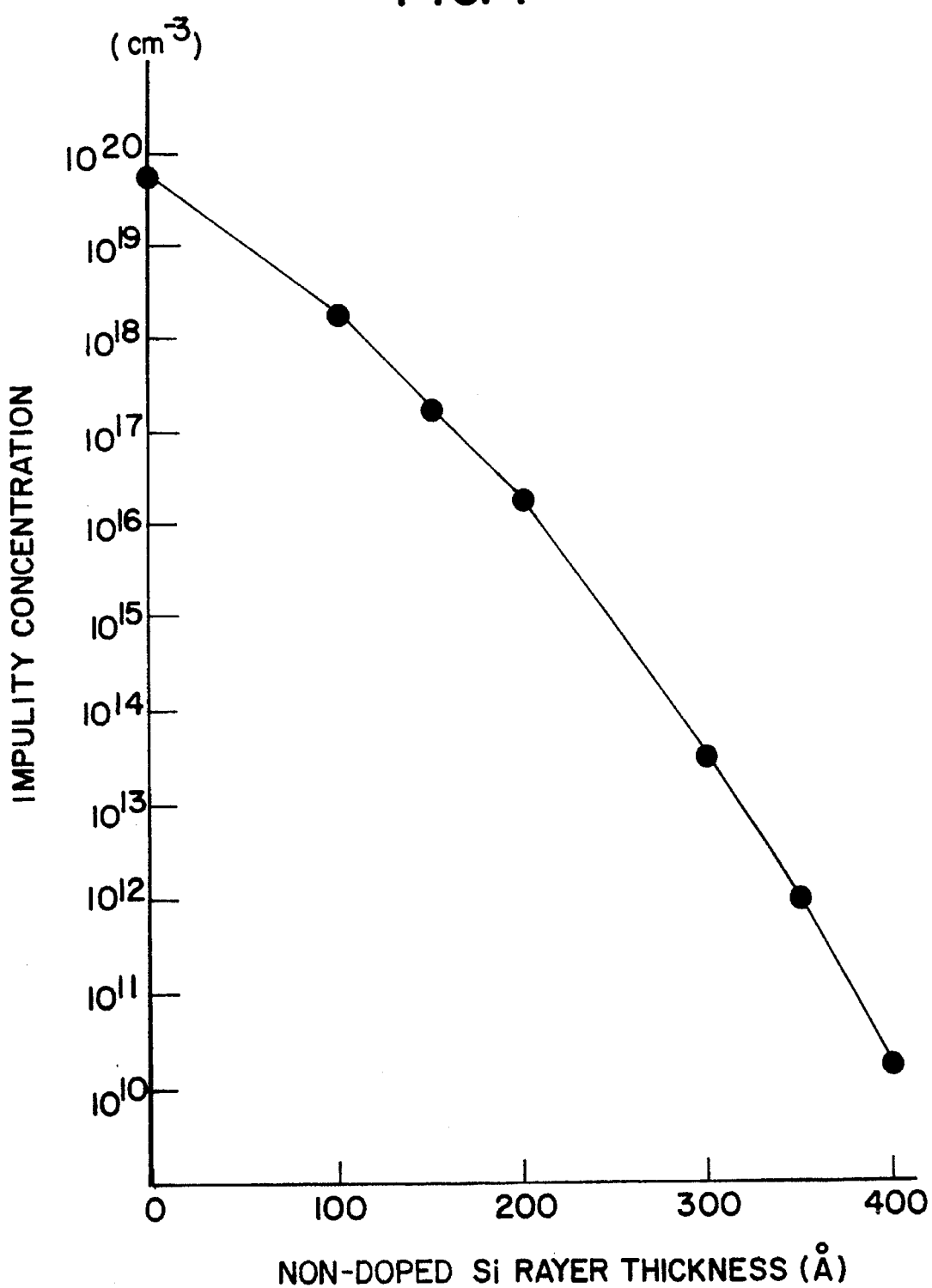
FIG. 4 shows impurity concentration (calculated value) at the interface between a channel forming region and a gate insulating film with variation of thickness of silicon film which is not doped (non-doped silicon film) in the film formation process in the embodiment.

FIG. 4 is a graph showing calculation values of the concentration of phosphorus at the interface between the channel forming region 17 and the gate insulating film 13 when the thickness of the non-doped silicon semiconductor layer 14 is varied every 100 Å from 0 Å to 400 Å. The calculation method is as follows. On the basis of the phosphorus concentration in the silicon semiconductor layer 15 whose phosphorus concentration is known, the diffusion amount of phosphorus into the non-doped silicon semiconductor layer 14 and the gate insulating film 13 at a temperature of 600° C. is calculated to thereby determine what concentration of phosphorus penetrating through the gate insulating film 13 exists in the vicinity of the interface between the channel forming region 17 and the gate insulating film 13 through 24 hour heat treatment at 600° C.

[Estimation Result]

As shown in FIG. 4, by providing the non-doped silicon semiconductor layer 14 at the gate electrode and increasing the thickness of the layer 14, the phosphorus concentration in the vicinity of the interface between the channel forming region 17 and the gate insulating film 13 can be decreased. In particular, by setting the thickness of the non-doped silicon semiconductor layer 14 at 400 Å or more, the phosphorus concentration in the vicinity of the interface between the channel forming region 17 and the gate insulating film 13 can be decreased to about $1\times10^{10}/cm^3$ even when phosphorus concentration of about $7\times10^{21}/cm^3$ is doped into the upper layer of the gate electrode. Accordingly, although abnormal diffusion of phosphorus due to the heat treatment and contamination of phosphorus in the forming process should be considered, these effects can be sufficiently suppressed.

Figure 1A:
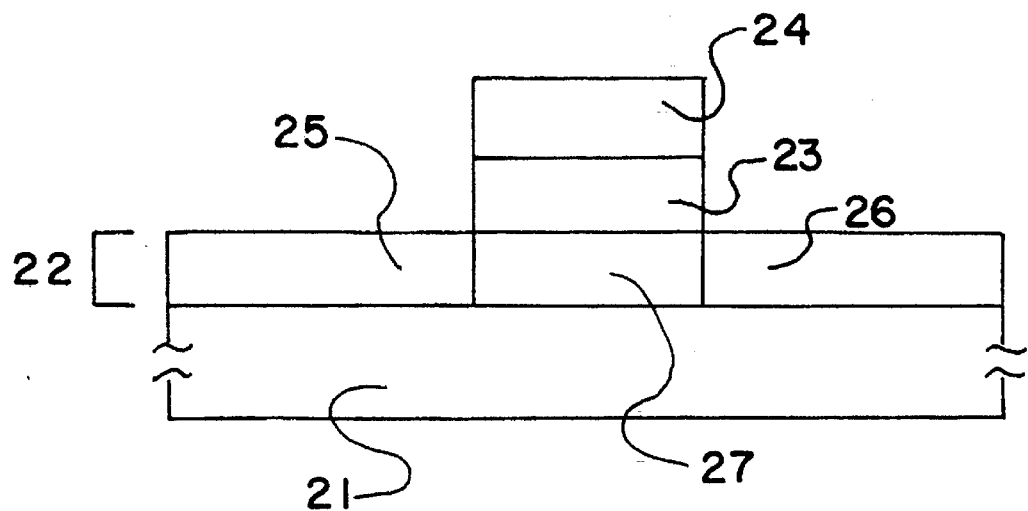
FIGS. 1A and 1B show a conventional basic structure of a TFT.
Figure 1B:
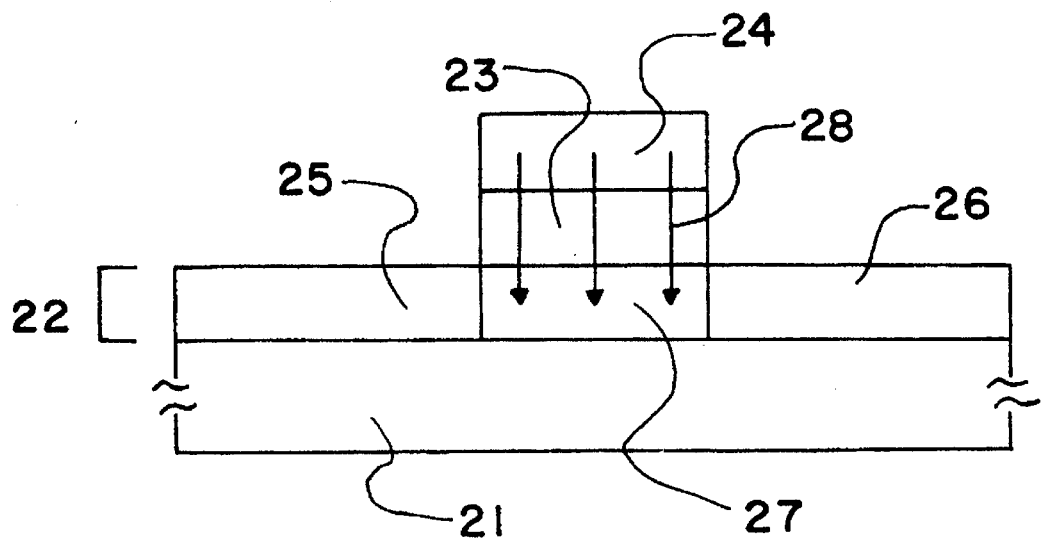
Figure 2:
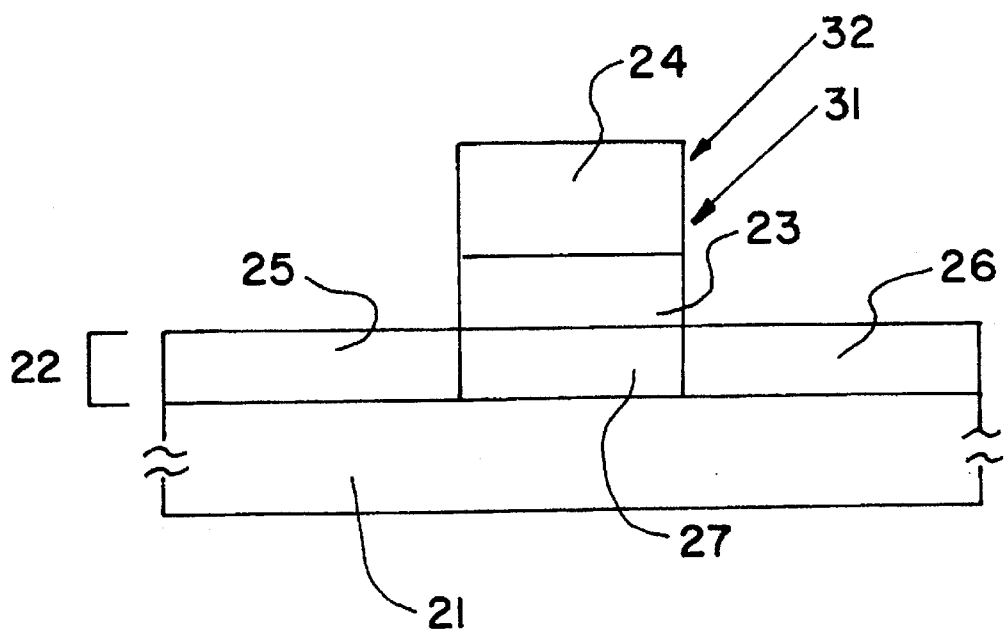
FIG. 2 shows a basic structure of a TFT of an embodiment of this invention.

In FIG. 4, the heat treatment temperature is 600° C., as described above. However, the present invention can be applied at the heat treatment temperature of 600° to 1000° C. In this temperature range, for example, concentration of the layer (region) 31 in which is in contact with the gate insulating film is $1\times10^{20}/cm^3$ to $1\times10^{11}/cm^3$, according to our calculation Accordingly, when the layer 31 in FIG. 2 has a desired concentration within this concentration range in accordance with the heat treatment temperature, the resistance of the gate electrode is reduced, and the adverse effect on the channel forming region due to diffusion of the impurity in the ion implantation process and the subsequent heat treatment process For annealing can be prevented.

[Embodiment 2]

In this embodiment, the gate electrode comprising the layers 14 and 15 in the TFT of the embodiment 1 is designed as a monolayer silicon film. This embodiment is different from the first embodiment only in the construction of the gate electrode and the film forming method thereof. Accordingly, in this embodiment the film forming method of the gate electrode will be described.

FIG. 5 shows the basic construction of the TFT of another embodiment. The portions other than the gate electrode 51 are the same as shown in FIG. 3, and the same elements are represented by the same reference numbers as in FIG. 3.

In the TFT as shown in FIG. 5, the gate electrode 51 is formed of silicon semiconductor, and in order to reduce the resistance thereof, phosphorus is doped at varied concentrations.

In this embodiment, the thickness of the gate electrode 51 is 2000 Å. Phosphorus is not doped into a lower layer portion 52 of 400 Å thickness in the film forming process, and a high concentration of phosphorous ($1\times10^{21}/cm^3$) is doped into an upper layer portion 53 of 1600 Å thickness in the film forming process.

The film forming method of the gate electrode is as follows. When the silicon film serving as the gate electrode 51 is formed by a vapor phase method such as the LPCVD (Low Pressure Chemical Vapor Deposition) method or the like, film formation is started without introducing phosphine ($PH_3$) serving as a raw material for doping phosphorus into a reaction chamber to form the silicon film 52 of 400 Å thickness. Thereafter, phosphine is introduced into a reaction chamber at a point during the film forming process so as to subsequently form the silicon film 53 of 1600 Å thickness which is doped with phosphorus.

This process further has process of introducing reactive gas containing an impurity for providing one conductivity type into a reaction chamber in comparison with the conventional film forming process, and thus it is industrially effective.

Further, in the above construction, the following concentration gradation method may be used in place of the introduction of phosphine at a point during the film forming process. That is, phosphine is not introduced at the starting of the film forming process, but it is introduced by gradually increasing the amount thereof during the film forming process. By this method, the gate electrode can be so designed that phosphorus concentration is low at the interface between the gate electrode 51 and the gate insulating film 13 and high at the surface of the gate electrode 51 opposite to the interface to make the resistance at this place low.

[Other structures using this invention]

Other structures using this invention are described below.

In the above, an N-channel type of TFT having the basic construction using this invention is shown. However, this invention may be applied to a TFT which is formed by performing ion implantation of an impurity for providing one conductivity type into a semiconductor using a gate electrode as a mask and performing heat treatment to form source and drain regions and also a channel forming region in a self-alignment structure. Further, the kind of semiconductor is not limited to silicon. In addition, crystallization of the semiconductor is not limited, and amorphous, microcrystal, polycrystal or the like is used in the present invention.

Further, this invention may be used as a construction or process thereof for preventing the diffusion of the impurity from the gate electrode into the channel forming region for TFTs which are formed by methods other than those using ion implantation.

According to this invention, in the TFT obtained by doping the impurity for providing one conductivity type through ion implantation to form the source region and the drain region in a self-alignment structure, the gate electrode is designed in the double layer structure wherein the silicon film doped with no impurity and the silicon film doped with high concentration impurity are laminated to each other on the gate insulating film side in that order. Therefore, the resistance of the gate electrode itself is reduced, and the adverse effect on the channel forming region due to diffusion of the impurity in the ion implantation process and the subsequent heat treatment process can be prevented.

Further, in the TFT using crystalline silicon (generally known as polysilicon), there occurs a problem in that the absolute value of the threshold value thereof is high. In order to solve this problem, it is effective to decrease the thickness of the gate insulating film. However, as described above, when the semiconductor material is used for the gate electrode, the existence of the impurity penetrating through the gate insulating film in the heat treatment process induces a critical problem, and thus it is difficult to decrease the thickness of the gate electrode.

However, according to this invention, the problem of penetration of the impurity through the gate insulating film can be solved by modifying the structure of the gate electrode, and thus the thickness of the gate insulating film can be decreased within the permissible range of conditions for pressure-proofing the gate insulating film, step coverage in the film forming process, film forming distribution, etc.

Accordingly, a TFT having a thin gate insulating film and thus a desired low threshold value can be formed.

What is claimed is:

1. An integrated circuit having a plurality of insulated gate field effect semiconductor devices connected with each other through a plurality of wirings, each semiconductor device comprising:

a gate insulating film; and a gate electrode having first and second regions and comprising a semiconductor material, wherein the first region is in contact with the gate insulating film and the second region is not in contact with the gate insulating film and connected to one of said wirings, wherein an impurity for providing one conductivity type has a first concentration in the first region of the gate electrode, and a second concentration higher than the first concentration in the second region.

2. The device of claim 1 wherein an impurity concentration in the gate electrode is stepwise decreased toward the gate insulating film.

3. The device of claim 1 wherein an impurity concentration in the gate electrode is continuously decreased toward the gate insulating film.

4. An integrated circuit having a plurality of insulated gate field effect semiconductor devices connected with each other through a plurality of wirings, each semiconductor device comprising:

a gate insulating film;

a gate electrode having first and second layers and comprising a semiconductor material, wherein the first layer is in contact with the gate insulating film and the second layer is not in contact with the gate insulating film and connected to one of said wirings, wherein an impurity for providing one conductivity type has a first concentration in said layer of the gate electrode, and a second concentration higher than the first concentration in the second region.

5. The device of claim 2 wherein an impurity concentration in the gate electrode is stepwise decreased toward the gate insulating film.

6. The device of claim 4 wherein an impurity concentration in the gate electrode is continuously decreased toward the gate insulating film.

7. An integrated circuit having a plurality of insulated gate field effect semiconductor devices connected with each other through a plurality of wirings, each semiconductor device comprising:

a gate insulating film; and a gate electrode having at least three layers, including one layer contacting the gate insulating film and a plurality of layers not in contact with the gate insulating film and connected to one of said wirings, and comprising a semiconductor material, wherein a concentration of an impurity for providing one conductivity type in the gate electrode is stepwise decreased toward the gate insulating film.

8. An integrated circuit having a plurality of insulated gate field effect semiconductor devices connected with each other through a plurality of wirings, each semiconductor device comprising:

a gate insulating film; and a gate electrode having at least first and second gate regions and comprising a semiconductor material, the gate electrode being formed on the gate insulating film, wherein a concentration of an impurity for establishing one conductivity type is doped in the first gate region and not in the second gate region, and the first gate region is connected to one of the wirings.

9. The device according to claim 8, wherein the second gate region is in contact with the gate insulating film.

10. The device according to claim 8, wherein the impurity includes phosphorus.

11. The device according to claim 8, wherein the one of the gate regions is in contact with the gate insulating film.

12. The device according to claim 8 wherein said second gate region is in contact with the gate insulating film.

13. An integrated circuit having a plurality of insulated gate field effect semiconductor devices connected with each other through a plurality of wirings, each semiconductor device comprising:

a semiconductor layer including an active region of a transistor;

a gate insulating layer contacting the semiconductor layer; and a gate electrode contacting the gate insulating layer and comprising a semiconductor material, wherein the gate electrode has a first region close to the gate insulating layer and a second region distant from the gate insulating layer and connected to one of the wirings, wherein concentration of an impurity for providing one conductivity type is $1\times10^{20}/cm^3$ to $1\times10^{11}/cm^3$ at the first region and the insulated gate field effect semiconductor device is annealed at temperature of 600° to 1000° C.

14. An integrated circuit having a plurality of insulated gate field effect semiconductor devices connected with each other through a plurality of wirings, each semiconductor device comprising:

a gate insulating film; and a gate electrode having at least three layers, including one layer contacting the gate insulating film and a plurality of layers not in contact with the gate insulating film and connected to one of said wirings, and comprising a semiconductor material, wherein concentration of an impurity for providing one conductivity type in the gate electrode is continuously decreased toward the gate insulating film.

* * * * *